(12) United States Patent
Na

(10) Patent No.: US 11,513,738 B2
(45) Date of Patent: Nov. 29, 2022

(54) MEMORY SYSTEM FOR PROCESSING A WRITE REQUEST AND MIGRATING DATA IN READ-INTENSIVE STATE AND OPERATING METHOD THEREOF

(71) Applicant: SK hynix Inc., Gyeonggi-do (KR)

(72) Inventor: Hyeong Ju Na, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/324,409

(22) Filed: May 19, 2021

(65) Prior Publication Data

US 2022/0229594 A1    Jul. 21, 2022

(30) Foreign Application Priority Data

Jan. 20, 2021  (KR) .......................... 10-2021-0007845

(51) Int. Cl.
*G06F 3/06*    (2006.01)

(52) U.S. Cl.
CPC .......... *G06F 3/0659* (2013.01); *G06F 3/0604* (2013.01); *G06F 3/064* (2013.01); *G06F 3/0647* (2013.01); *G06F 3/0673* (2013.01)

(58) Field of Classification Search
CPC ...... G06F 3/0659; G06F 3/0604; G06F 3/064; G06F 3/0647; G06F 3/0673
See application file for complete search history.

(56) References Cited

U.S. PATENT DOCUMENTS

| | | | |
|---|---|---|---|
| 9,037,792 B1 * | 5/2015 | Ingle | G06F 12/0866 |
| | | | 711/113 |
| 10,971,215 B1 * | 4/2021 | Yang | G11C 29/44 |
| 11,042,307 B1 * | 6/2021 | Li | G06F 3/064 |
| 2018/0101477 A1 * | 4/2018 | Kan | G06F 12/0246 |
| 2018/0181320 A1 * | 6/2018 | Ji | G06F 3/0619 |
| 2018/0232173 A1 * | 8/2018 | Chung | G06F 3/0653 |
| 2021/0034553 A1 * | 2/2021 | Byron | G06F 12/0879 |
| 2021/0200448 A1 * | 7/2021 | Chen | G06F 3/0611 |
| 2022/0026977 A1 * | 1/2022 | Sanders | G06F 3/0634 |

FOREIGN PATENT DOCUMENTS

| | | |
|---|---|---|
| KR | 10-2015-0106447 | 9/2015 |
| KR | 10-2018-0012653 | 2/2018 |

* cited by examiner

*Primary Examiner* — Sean D Rossiter
(74) *Attorney, Agent, or Firm* — IP & T Group LLP

(57) ABSTRACT

Embodiments of the present disclosure relate to a memory system and an operating method thereof. According to embodiments of the present disclosure, a memory system may determine whether the memory system is in a read-intensive state; when determined that the memory system is in the read-intensive state, process a write request received from a host using at least one first type memory block among the plurality of memory blocks, and migrate data stored in a second type memory block to the at least one first type memory block; and set a number of bits that can be stored in a memory cell included in the first type memory block to be less than a number of bits that can be stored in a memory cell included in the second type memory block.

20 Claims, 16 Drawing Sheets

```
┌─────────────────────────────────────────────┐
│ Determine whether in read-intensive state   │──S1510
└─────────────────────────────────────────────┘
                    │
┌─────────────────────────────────────────────┐
│ When determined in read-intensive state,    │
│ process write request from host using       │
│ 1st type memory block, and migrate          │──S1520
│ data stored in 2nd type memory block        │
│ to 1st type memory block                    │
└─────────────────────────────────────────────┘
```

MEMORY SYSTEM FOR PROCESSING A WRITE REQUEST AND MIGRATING DATA IN READ-INTENSIVE STATE AND OPERATING METHOD THEREOF

CROSS-REFERENCE TO RELATED APPLICATION

The present application claims priority under 35 U.S.C. 119(a) to Korean patent application number 10-2021-0007845 filed on Jan. 20, 2021, which is incorporated herein by reference in its entirety.

BACKGROUND

1. Technical Field

The embodiments of the present disclosure relate to a memory system and an operating method thereof.

2. Related Art

A memory system includes a data storage device that stores data on the basis of a request from a host, such as a computer, servers, a smartphone, a tablet PC, or other electronic devices. The examples of the memory system span from a traditional magnetic-disk-based hard disk drive (HDD) to a semiconductor-based data storage device such as a solid state drive (SSD), a universal flash storage device (UFS), or an embedded MMC (eMMC) device.

The memory system may further include a memory controller for controlling a memory device. The memory controller may receive a command from the host and, on the basis of the received command, may execute the command or control read/write/erase operations on the memory devices in the memory system. The memory controller may be used to execute firmware operations for performing a logical operation for controlling such operations.

As technology advances, the storage capacity of the memory system is gradually increasing. The number of storable bits per memory cell included in a memory device is increasing in order to increase the storage capacity of the memory system. However, when the number of storable bits per memory cell increases, the total storage capacity of the memory system may increase, but there may be an issue in which the reliability of stored data and read/write performance decreases.

SUMMARY

Embodiments of the present disclosure may provide a memory system and an operating method thereof capable of improving performance and reliability in environments in which read operations are frequently executed.

In one aspect, embodiments of the present disclosure may provide a memory system including a memory device including a plurality of memory blocks, and a memory controller for communicating with the memory device and controlling the memory device.

The memory controller may determine whether the memory system is in a read-intensive state.

The memory controller may, when it is determined that the memory system is in the read-intensive state, process a write request received from a host, which is configured to request the memory system to read or write data by using at least one first type memory block among the plurality of memory blocks, and may migrate data stored in at least one second type memory block among the plurality of memory blocks to the at least one first type memory block.

The memory controller may set a number of bits that can be stored in a memory cell included in the first type memory block to be less than a number of bits that can be stored in a memory cell included in the second type memory block.

In another aspect, embodiments of the present disclosure may provide an operating method of a memory system including a memory device having a plurality of memory blocks.

The operating method of the memory system may include determining whether the memory system is in a read-intensive state.

The operating method of the memory system may include, when it is determined that the memory system is in the read-intensive state, processing a write request received from a host, which is configured to request the memory system to read or write data by using at least one first type memory block among the plurality of memory blocks, and migrating data stored in at least one second type memory block among the plurality of memory blocks to the at least one first type memory block.

In this case, A number of bits that can be stored in a memory cell included in the first type memory block may be less than a number of bits that can be stored in a memory cell included in the second type memory block.

In another aspect, embodiments of the present disclosure may provide a memory system including a nonvolatile memory device including memory blocks each designated as one of a single-level-cell memory block and a multiple-level-cell memory block and a controller configured to control, while the memory device is in a read-intensive state.

The memory device may perform a write operation only on one or more of the single-level-cell memory blocks.

The memory device may migrate data from one or more of the multiple-level-cell memory blocks to one or more of the single-level-cell memory blocks.

The controller may be configured to change the designation of each of the memory blocks between the single-level-cell memory block and the multiple-level-cell memory block.

According to embodiments of the present disclosure, it is possible to improve the performance and reliability in environments where the read operation is frequently executed.

DETAILED DESCRIPTION

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

Figure 1:
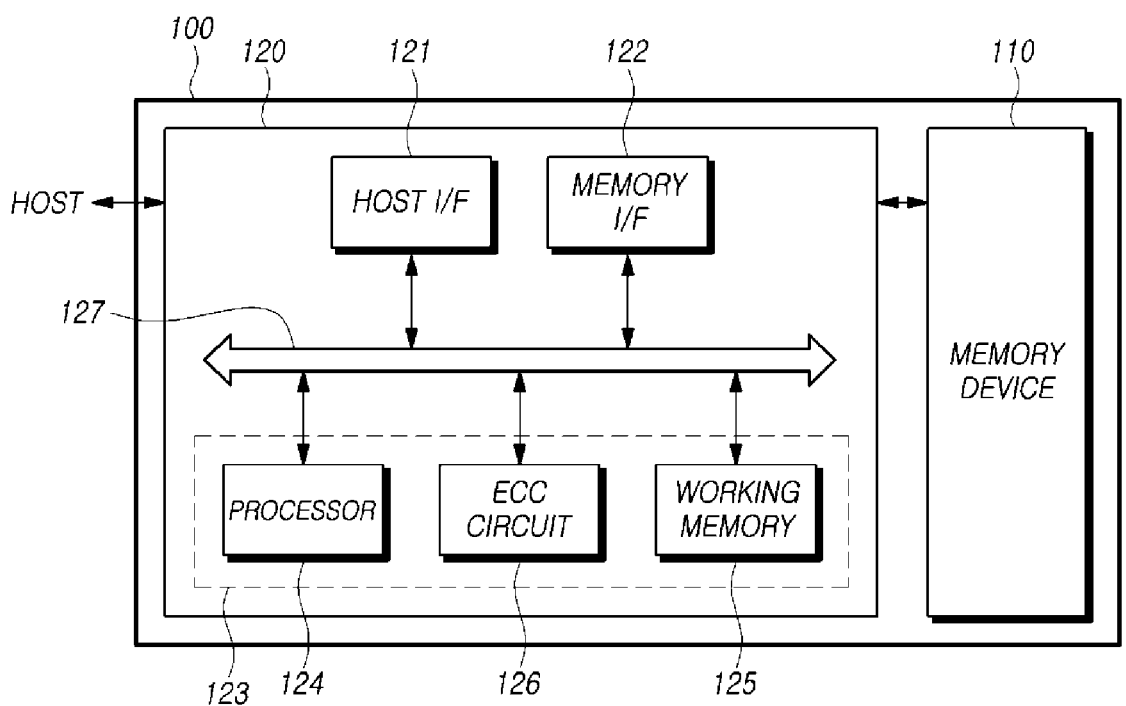
FIG. 1 is a schematic diagram illustrating a configuration of a memory system based on an embodiment of the disclosed technology.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. For example, address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. The processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In the present disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 (that is, the host interface 121, the memory interface 122, the processor 124, the working memory 125 and the error detection/correction circuit 126) of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
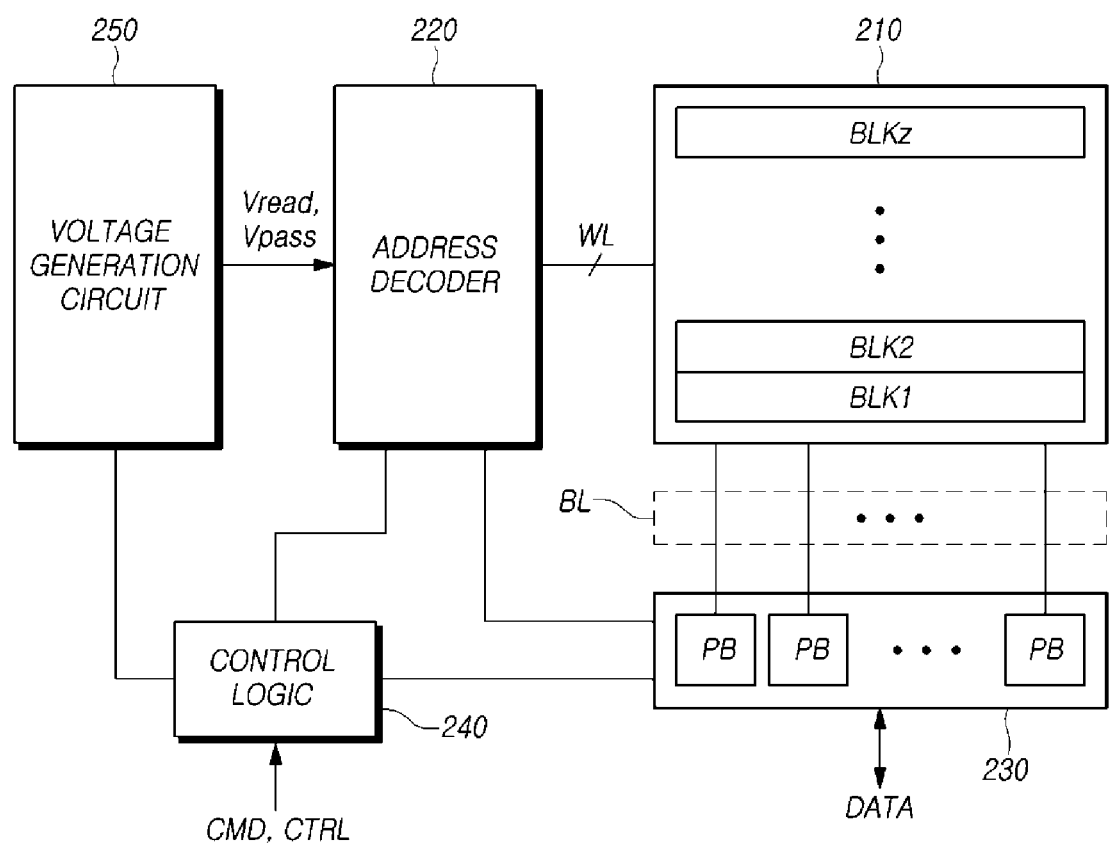
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or greater than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
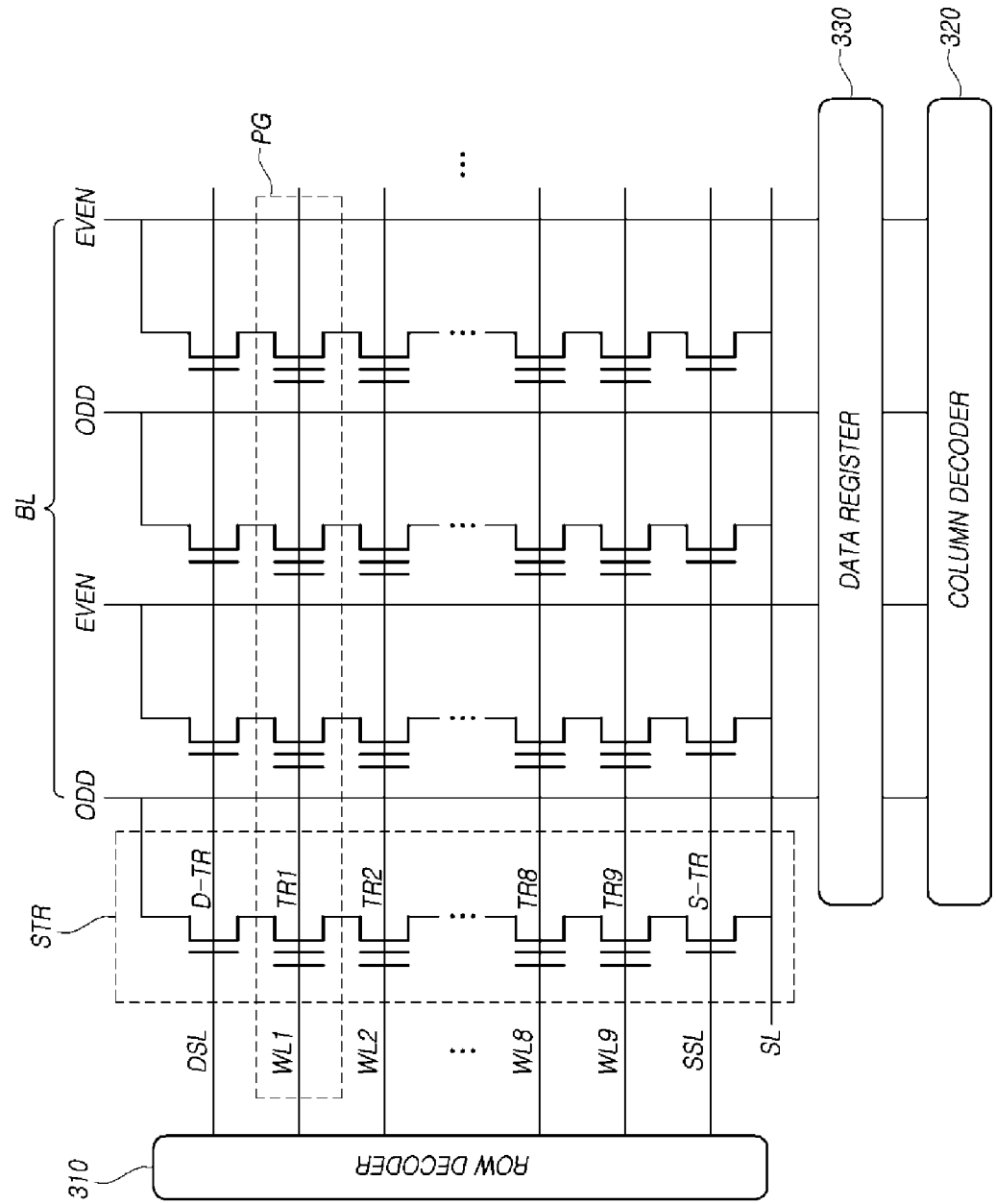
FIG. 3 is a diagram illustrating a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) to include circuitry that used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of an odd-numbered bit line and an even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
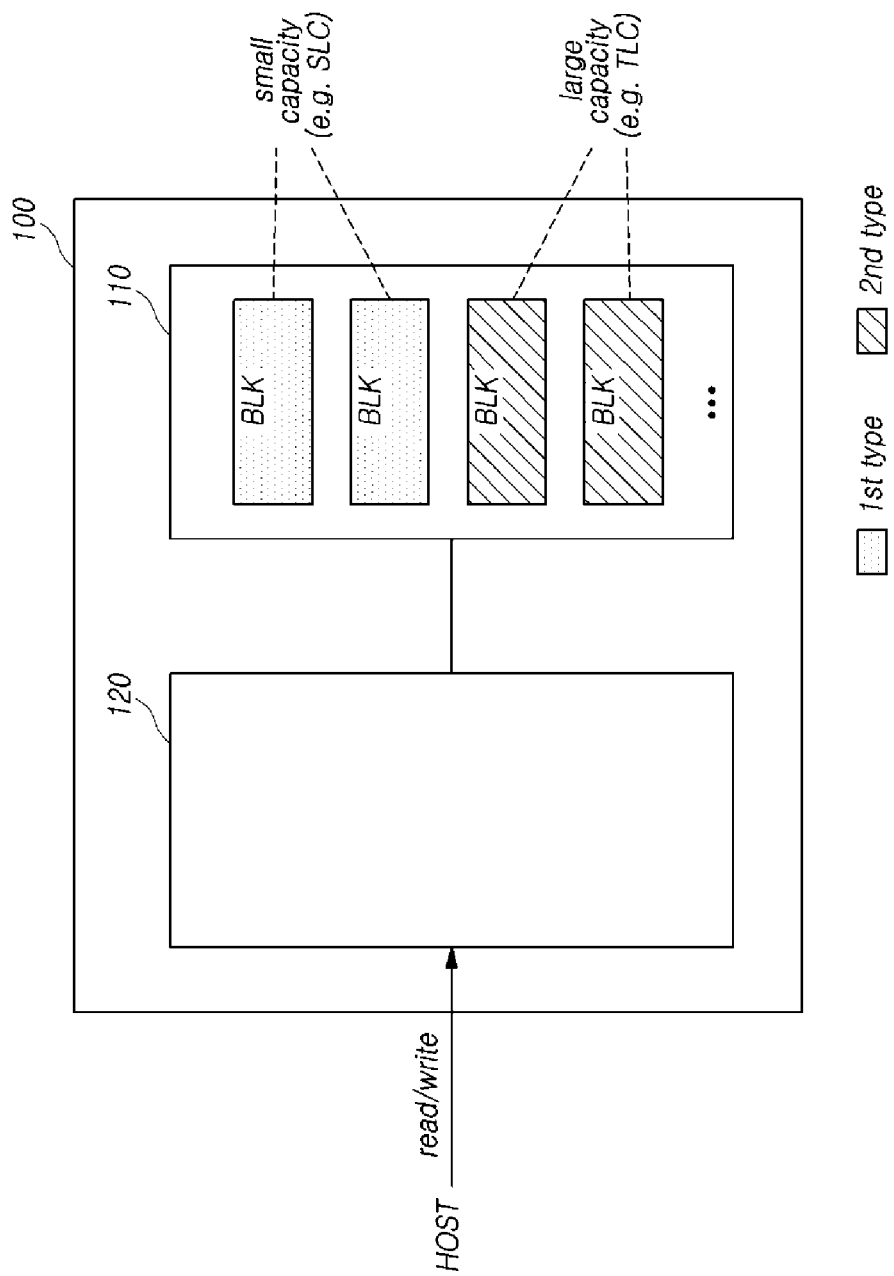
FIG. 4 is a diagram illustrating a schematic structure of a memory system according to embodiments of the present disclosure.

FIG. 4 is a diagram illustrating a schematic structure of a memory system 100 according to embodiments of the present disclosure.

Referring to FIG. 4, a memory controller (e.g., memory controller 120 of FIG. 1) of a memory system (e.g., memory system 100 of FIG. 1) may receive a read request or a write request from a host, and may process the read request or the write request received from the host. The memory controller 120 may receive the read request or the write request from the host through a command.

In addition, the memory controller 120 may use a plurality of memory blocks included in the memory device 110 to process the read request or the write request received from the host. The memory controller 120 may read data stored in the plurality of memory blocks to process the read request received from the host. The memory controller 120 may write data to the plurality of memory blocks to process the write request received from the host.

In this case, the plurality of memory blocks included in the memory device 110 may include one or more first type memory blocks and one or more second type memory blocks.

The memory controller 120 may set the number of bits that can be stored by a memory cell included in the first type memory block to be less than the number of bits that can be stored by a memory cell included in second type memory block, for the above-described first type memory block and second type memory block. For example, the memory controller 120 may set the memory cell included in the first type memory block as SLC, and may set the memory cell included in the second type memory block as MLC, TLC, or QLC.

In this case, the storage capacity of the first type memory block is less than the storage capacity of the second type memory block.

However, a retention time of the data stored in the first type memory block is longer than a retention time of the data stored in the second type memory block, and the frequency of background operation for retaining the data stored in the first type memory block is less than the frequency of background operation for retaining data stored in the second type memory block. The time required to program (write) data into the memory cells included in the second type memory block is longer than the time required to program data into the memory cells included in the first type memory block. Further, the damage of the memory cell in the process of programming data into the memory cell included in the second type memory block is greater than the damage of the memory cell in the process of programming data into the memory cell included in the first type memory block.

In addition, a read/write operation speed of the first type memory block is faster than a read/write operation speed of the second type memory block.

The maximum number of program/erase cycles that the first type memory block can tolerate is also greater than the maximum number of program/erase cycles that the second type memory block can tolerate. For example, if the first type memory block is the SLC block and the second type memory block is the TLC block, the storage capacity of the first type memory block is ⅓ of the second type memory block, but the maximum number of program/erase cycles of the first type memory block is ten times the maximum number of program/erase cycles of the second type memory block. Accordingly, the total amount of data that can be programmed into the first type memory block is greater than the second type memory. Therefore, when utilizing the first type memory block more than the second type memory block, the total bytes written (TBW) of the memory system 100 may become greater.

Therefore, the read/write performance and reliability of the first type memory block are superior to the read/write performance and reliability of the second type memory block.

Thus, the memory controller 120 may adjust a total storage capacity, a read/write performance and a reliability of the memory system 100 by adjusting the number of first type memory blocks and the number of second type memory blocks among the plurality of memory blocks included in the memory device 110.

Specifically, if the memory controller 120 increases the number of first type memory blocks, the total storage capacity of the memory system 100 may decrease, but read/write performance and reliability may increase. On the other hand, if the memory controller 120 increases the number of second type memory blocks, the total storage capacity of the memory system 100 may increase, but read/write performance and reliability may decrease.

The memory controller 120 of the memory system 100 may adjust the number of first type memory blocks and the second type among the plurality of memory blocks included in the memory device 110 according to the state of the memory system 100.

As an example, the memory system 100 may be in a read-intensive state or a write-intensive state.

The read-intensive state of the memory system 100 may mean that the memory system 100 is in a state in which the read operation is executed at a higher rate compared to the write operation. When the memory system 100 is in the read-intensive state, the ratio of the amount of the data read from the memory system 100 by the host to the amount of data written to the memory system 100 by the host during a specific time period (The specific time period may be arbitrarily determined by the memory system 100) may be greater than or equal to a specific value. For example, the memory system 100 used in a smart watch or in an automotive application has a small amount of data to be stored and may mainly execute the read operation rather than the write operation. That is, the memory system 100 used in a smart watch or in an automotive application may be mainly in the read-intensive state.

On the other hand, the write-intensive state of the memory system 100 may mean that the memory system 100 is in a state in which a rate of executing the read operation is lower than that of the write operation. When the memory system 100 is in the write-intensive state, the rat of the amount of the data read from the memory system 100 by the host to the amount of data written to the memory system 100 by the host during the specific time period may be less than a specific value. The specific time period used to determine whether the memory system is in the write-intensive state may be equal to or different from the specific time period used to determine whether the memory system is in the read-intensive state.

Hereinafter, an operation performed when the memory controller 120 of the memory system 100 determines whether the memory system 100 is in the read-intensive state and determines that the memory system 100 is in the read-intensive state will be described.

Figure 5:
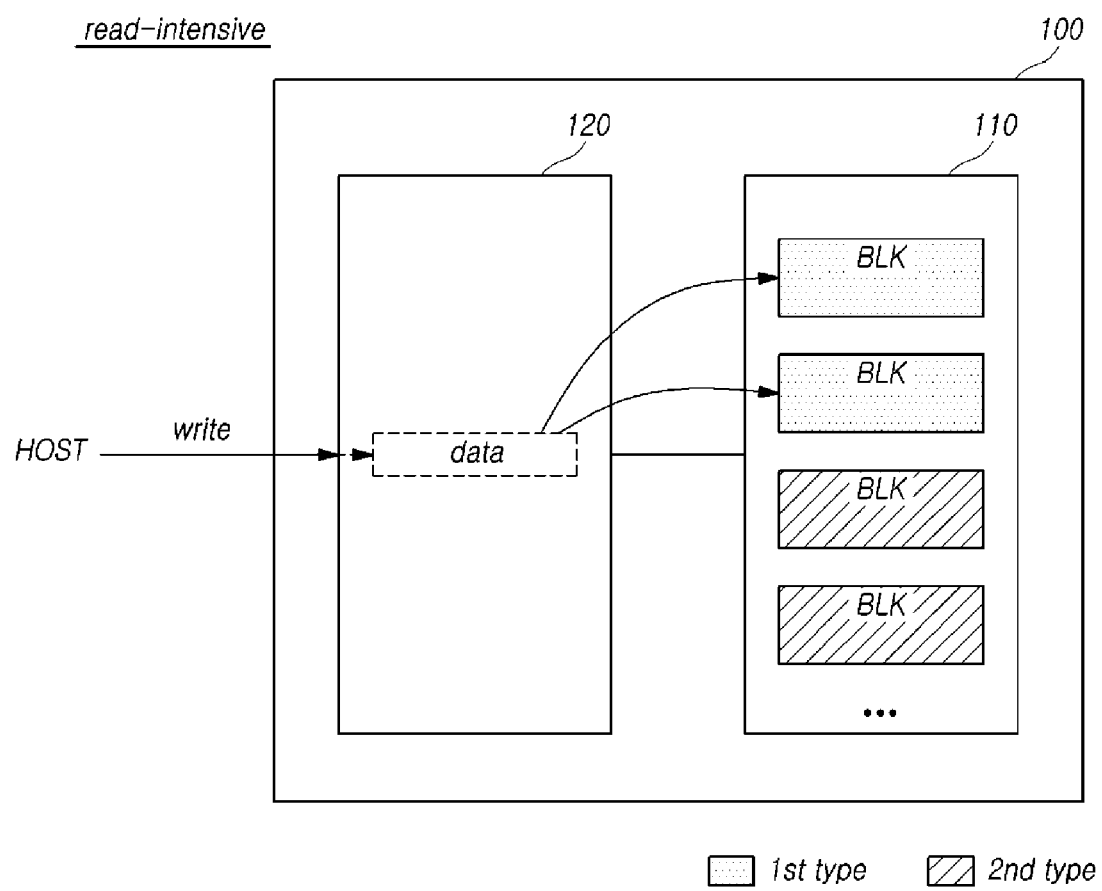
FIGS. 5 and 6 are diagrams illustrating an example of an operation performed when a memory system according to embodiments of the present disclosure is in a read-intensive state.
Figure 6:
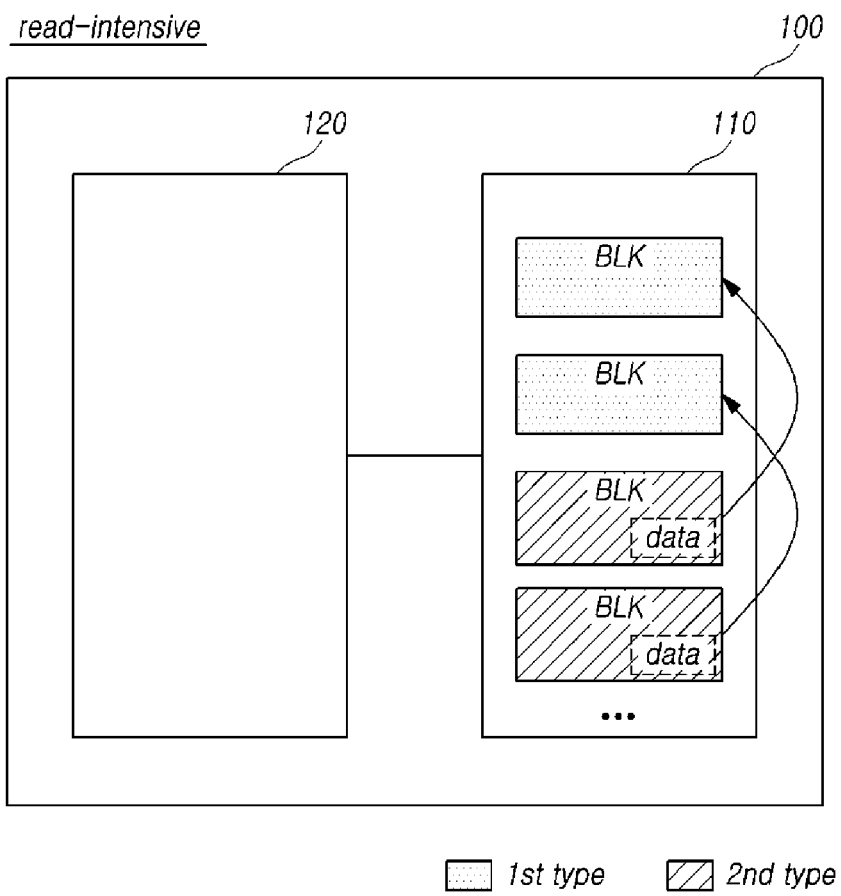

FIGS. 5 to 6 are diagrams illustrating examples of an operation performed when a memory system 100 according to embodiments of the present disclosure is in a read-intensive state.

First, referring to FIG. 5, when it is determined that a memory system is in a read-intensive state, a memory controller 120 of the memory system 100 may process a write request received from a host using only a first type memory block. Specifically, when data that is write-requested by the host is stored in the memory device 110, the memory controller 120 may control the data to be stored only in the first type memory block and not be stored in the second type memory block.

Further, referring to FIG. 6, when it is determined that a memory system is in a read-intensive state, the memory controller 120 of the memory system 100 may migrate the data stored in a second type memory block to a first type memory block.

When the memory system 100 is in the read-intensive state, since the amount of data written to the memory device 110 of the memory system 100 is small, the memory controller may be not required to increase the amount of data that can be stored per block in order to store large amounts of data. On the other hand, in order to quickly process the read request received from the host, the memory controller 120 may store data read by the host in a memory block having a high operating speed and high reliability.

Therefore, in order to store as much data as possible in the first type memory block having high operating speed and high reliability, the memory controller 120 may process the write request received from the host using only the first type memory block, and migrate the data stored in the second type memory block to the first type memory block. In this case, since the amount of data written to the memory device 110 is small, even if the write request received from the host is stored only in the first type memory block, possibility of having insufficient data storage capacity may be low.

As described above, when the memory system 100 is in the read-intensive state, it is possible to improve the performance and reliability of the memory system 100 in an environment where read operations frequently occur by processing the write request received from the host using the first type memory block, and migrating data stored in the second type memory block to the first type memory block.

However, in order for the memory system 100 to perform the operations described above in FIGS. 5 to 6 in the read-intensive state, it is required to accurately determine whether the memory system 100 is in the read-intensive state. If it is determined that the memory system 100 is in the read-intensive state despite the frequency of executing the write operation being high, there may be an issue in which the frequency of writing data to the first type memory block is excessively increased. In addition, the overall performance of the memory system 100 may deteriorate due to performing a garbage collection operation to resolve this issue. In addition, since the storage capacity of the first type memory block is less than that of the second type memory block, it is required to also consider the total capacity of data stored by the memory system 100.

Hereinafter, a specific operation of determining whether the memory system 100 is in the read-intensive state in the embodiments of the present disclosure will be described. First, it will be described the timing of determining whether the memory system 100 is in the read-intensive state.

Figure 7:
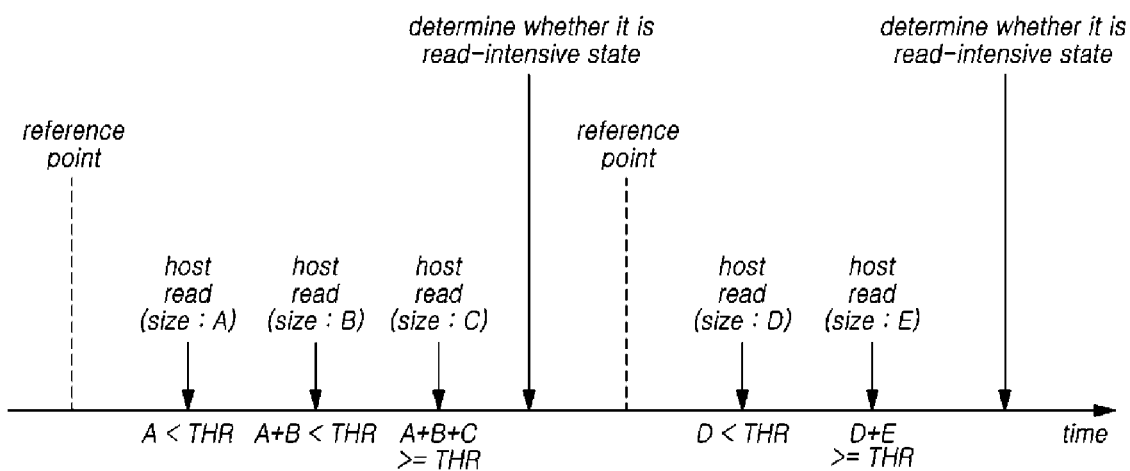
FIG. 7 is a diagram illustrating a time point to determine whether a memory system according to embodiments of the present disclosure is in a read-intensive state.

FIG. 7 is a diagram illustrating a time point to determine whether the memory system 100 according to embodiments of the present disclosure is in a read-intensive state.

Referring to FIG. 7, the memory controller 120 of the memory system 100 may determine whether the memory system 100 is in a read-intensive state in the case that the total amount of data that are read-requested by the host from a set reference time point is equal to or greater than a set threshold THR. As an example, the memory controller 120 may determine whether the memory system 100 is in the read-intensive state whenever the total amount of data that are read-requested by the host exceeds 1 GB.

In FIG. 7, a host requests to read data of size A from the memory system 100 after the reference time point is initially set. In this case, since the size of A is less than the threshold THR, the memory controller 120 does not determine that the memory system is in the read-intensive state.

Next, the host requests to read data of size B to the memory system 100. At this time, since the sum of the size of A and the size of B is less than the threshold THR, the memory controller 120 still does not determine that the memory system is in the read-intensive state.

Next, the host requests to read data of size C to the memory system 100. In this case, since the sum of the size of A, the size of B, and the size of C is equal to or greater than the threshold THR, the memory controller 120 determines whether the memory system is in the read-intensive state.

Furthermore, after determining whether the memory system 100 is in the read-intensive state, the reference time point may be set again. The reference time point may be set again even if the memory system 100 is determined to be in the read-intensive state.

After setting again the reference time point, the host requests to read data of size D to the memory system 100. In this case, since the size of D is less than the threshold THR, the memory controller 120 does not yet determine whether the memory system is in the read-intensive state.

Next, the host requests to read data of size E to the memory system 100. In this case, since the sum of the size of D and the size of E is greater than or equal to the threshold THR, the memory controller 120 determines that the memory system is in the read-intensive state.

Figure 8:
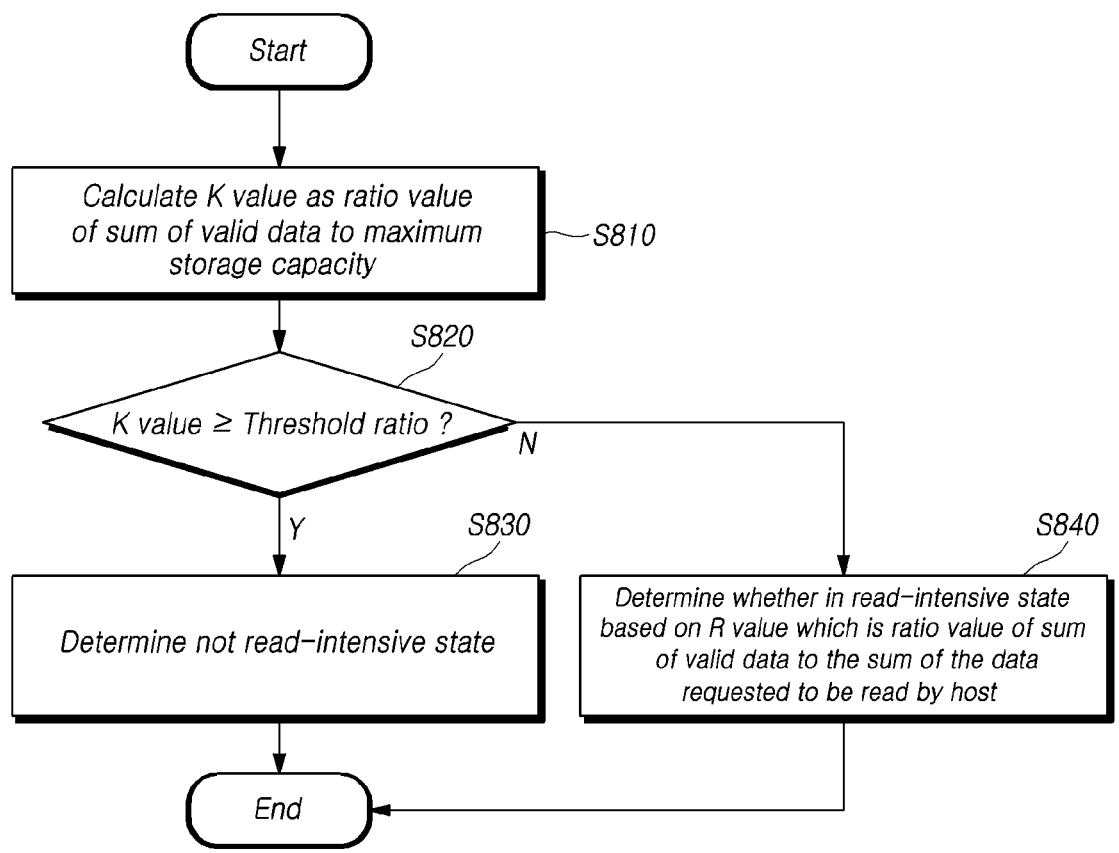
FIGS. 8 and 9 are flowcharts illustrating an operation of determining whether a memory system is in a read-intensive state according to embodiments of the present disclosure.
Figure 9:
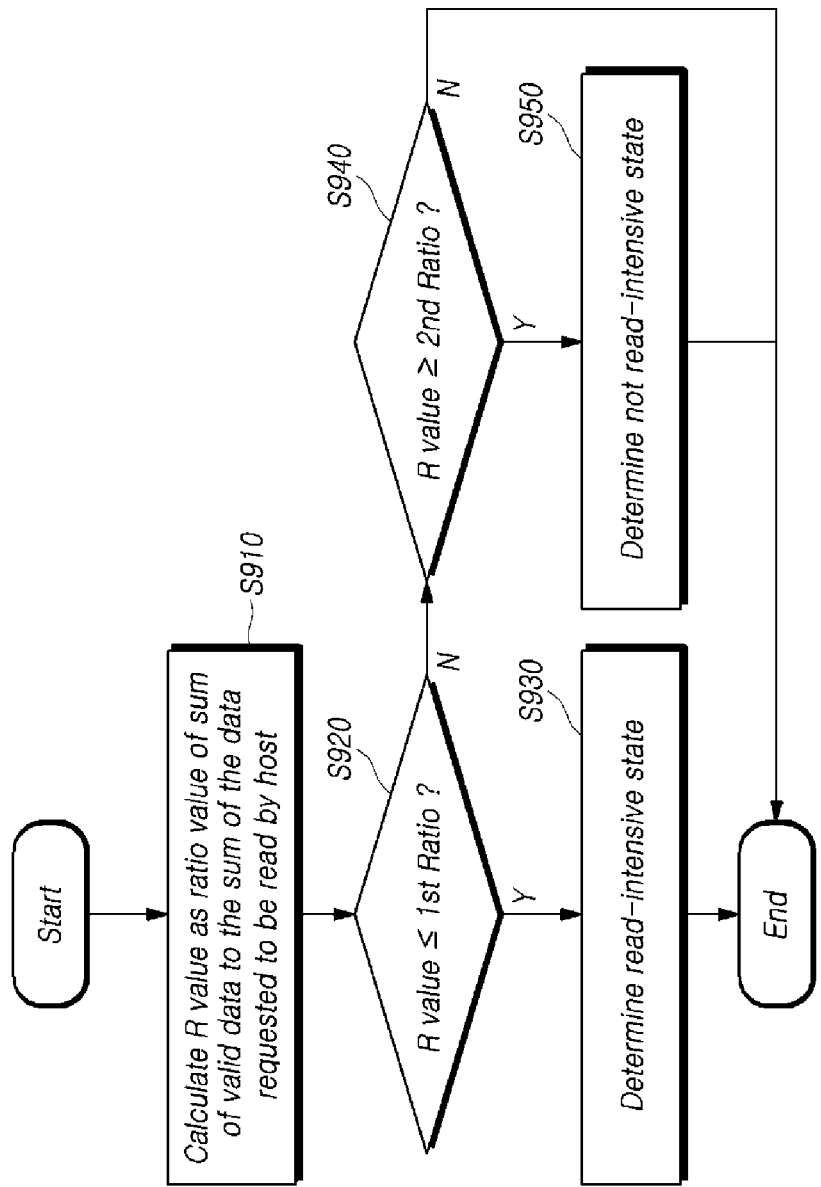

FIGS. 8 to 9 are flowcharts illustrating an operation of determining whether the memory system 100 is in a read-intensive state according to embodiments of the present disclosure.

First, referring to FIG. 8, the memory controller 120 of the memory system 100 may calculate a K value, which is a ratio (e.g., percentage) value of the total amount of valid data stored in the memory device 110 to the maximum storage capacity or total capacity of the memory device 110 (S810).

The maximum storage capacity or total capacity of the memory device 110 may refer to a maximum capacity of data that can be stored in the plurality of memory blocks included in the memory device 110. In addition, valid data stored in the memory device 110 may mean data that is accessible by the host.

For example, if the maximum storage capacity of the memory device 110 is 10 GB and the total amount of valid data stored in the memory device 110 is 3 GB, the K value is (3 GB)/(10 GB)=30%.

The memory controller 120 may determine whether the K value calculated in operation S810 is equal to or greater than the set threshold ratio (S820).

In the case that the K value is greater than or equal to the set threshold ratio (S820-Y), the memory controller 120 determines that the memory system 100 is not in the read-intensive state (S830).

On the other hand, when the K value is less than the set threshold ratio (S820-N), the memory controller 120 may determine whether the memory system 100 is in the read-intensive state based on the R value, which is a ratio value of the total amount of valid data stored in the memory device 110 to the total amount of the data that are read-requested by the host (S840).

An example of an operation of operation S840 will be described in detail with reference to FIG. 9 below.

Referring to FIG. 9, the memory controller 120 of the memory system 100 may calculate the R value, which is a ratio (e.g., percentage) value of the total amount of valid data stored in the memory device 110 to the total amount of data that are read-requested by a host (S910). For example, if the total amount of data that are read-requested by the host is 20 GB and the total amount of valid data is 3 GB, the R value is (3 GB)/(20 GB)=15%.

The memory controller 120 first determines whether the R value calculated in operation S910 is less than or equal to a set first ratio (S920).

If the R value is less than or equal to the first ratio (S920-Y), the memory controller 120 determines that the memory system 100 is in the read-intensive state (S930). This is because the amount of data read by the host is larger than the amount of data stored in the memory system 100.

On the other hand, when the R value exceeds the first ratio (S920-N), the memory controller 120 determines whether the R value is greater than or equal to a second ratio (S940). In this case, the value of the second ratio may be greater than or equal to the value of the first ratio. For example, if the values of the first ratio and the second ratio are the same, the frequency at which whether the memory system 100 is determined to be in the read-intensive state may increase excessively, so the value of the second ratio may be set to a specific value or more than the first ratio.

If the R value is greater than or equal to the second ratio (S940-Y), the memory controller 120 determines that the memory system 100 is not in the read-intensive state (S950). This is because the amount of data read by the host is less than the amount of data stored in the memory system 100.

In the above, a specific operation of determining whether the memory system 100 is in the read-intensive state has been described. Hereinafter, a specific operation performed by the memory system 100 when it is determined that the memory system 100 is in the read-intensive state will be described.

Figure 10:
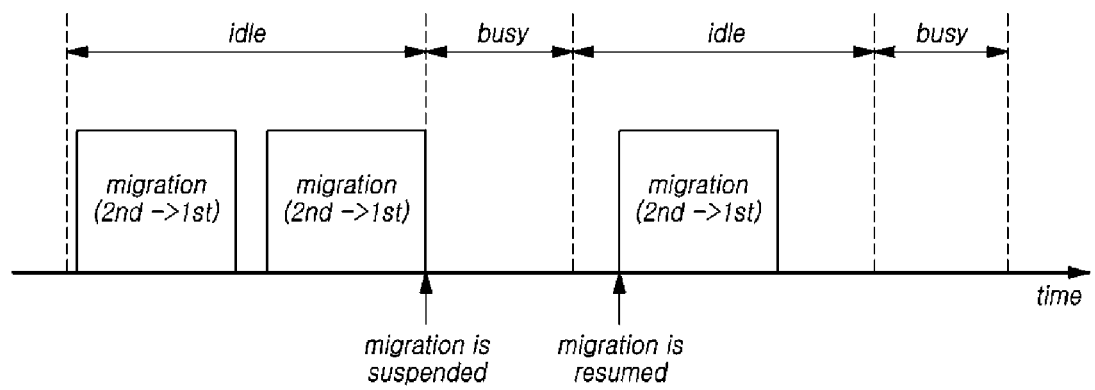
FIG. 10 is a diagram illustrating an example in which a memory system according to embodiments of the present disclosure performs a migration operation in a read-intensive state.

FIG. 10 is a diagram illustrating an example in which the memory system 100 according to embodiments of the present disclosure performs a migration operation in a read-intensive state.

Referring to FIG. 10, the memory controller 120 of the memory system 100 may execute an operation of migrating data stored in a second type memory block to a first type memory block in an idle state. In this case, the idle state may mean a state in which the memory system 100 does not execute a request received from a host (e.g. read/write/erase request) or a background operation (e.g. garbage collection/wear leveling). On the other hand, the state in which the memory system 100 is executing the request received from the host or the background operation may be referred to a busy state of the memory system 100.

The memory controller 120 may first execute the operation of migrating data stored in the second type memory block to the first type memory block in the idle state.

In the case that the state of the memory system 100 changes from the idle state to the busy state, the memory controller 120 may suspend migrating data stored in the second type memory block to the first type memory block. This is to prevent a delay in the request received from the host or the background operation due to the operation of migrating data stored in the second type memory block to the first type memory block.

The memory controller 120 may resume the operation of migrating data stored in the second type memory block to the first type memory block after the state of the memory system 100 is changed from the busy state to the idle state again.

In this case, if the host accesses corresponding data before migrating the data stored in the second type memory block to the first type memory block due to insufficient time for the memory system 100 to be idle, the memory system 100 may read the corresponding data from the second type memory block.

Figure 11:
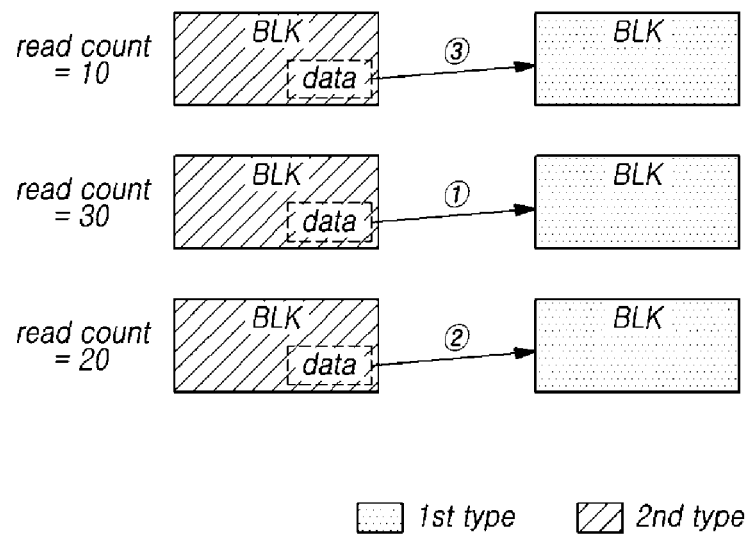
FIG. 11 is a diagram illustrating sequences of performing a migration operation in a read-intensive state by a memory system according to embodiments of the present disclosure.

FIG. 11 is a diagram illustrating sequences of performing a migration operation in a read-intensive state by the memory system 100 according to embodiments of the present disclosure.

Referring to FIG. 11, the memory controller 120 of the memory system 100 may determine an order of migrating data stored in a second type memory block to a first type memory block according to a descending order of read counts of the second type memory blocks. This is because there is a high possibility that data stored in the memory block having a high read count will be read by the host later.

In FIG. 11, read counts corresponding to each of three second type memory blocks are 10, 30, and 20, respectively. In this case, the memory controller 120 may first migrate, to the first type memory block, data stored in the memory block having the largest read count value (read count=30) among the three second type memory blocks (①). Then, the memory controller 120 may migrate, to the first type memory block, the data stored in the memory block having the second largest read count value (read count=20) (②). Then, the memory controller 120 may migrate, to the first type memory block, the data stored in a memory block having the smallest read count value (read count=10) among the three second type memory blocks (③).

Figure 12:
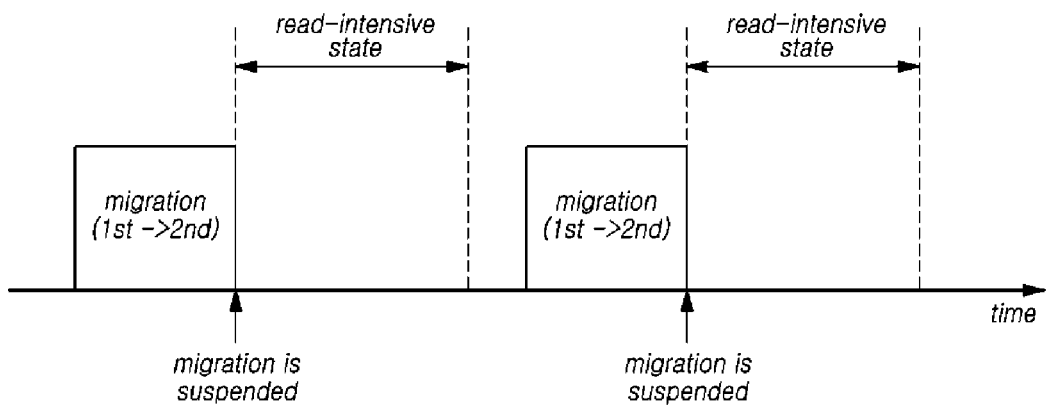
FIG. 12 is a diagram illustrating an example of an operation of migrating data stored in a first type memory block to a second type memory block by a memory system according to embodiments of the present disclosure.

FIG. 12 is a diagram illustrating an example of an operation of migrating data stored in a first type memory block to a second type memory block by the memory system 100 according to embodiments of the present disclosure.

Referring to FIG. 12, when it is determined that a memory system is in a read-intensive state, the memory controller 120 of the memory system 100 may suspend the operation of migrating data stored in a first type memory block to a second type memory block.

In general, the memory controller 120 may first write data to be written into the first type memory block in order to write data received from a host at high speed. However, since the storage capacity per block of the first type memory block is smaller than the storage capacity per block of the second type memory block, the memory controller 120 may migrate data written in the first type memory block to the second type memory block to efficiently store data.

However, in a read-intensive state, the memory controller 120 is not required to migrate the data written to the first type memory block to the second type memory block. This is because in the read-intensive state, even if data is not migrated to the second type memory block, since the storage capacity of the memory system 100 is sufficient, the more data that is stored in the first type memory block, the higher the read performance can be secured.

Therefore, when it is determined that the memory system is in the read-intensive state, the memory controller 120 may suspend the operation of migrating data stored in the first type memory block to the second type memory block. When it is determined that the memory system is not in the read-intensive state, the memory controller 120 may resume the operation of migrating data stored in the first type memory block to the second type memory block.

Figure 13:
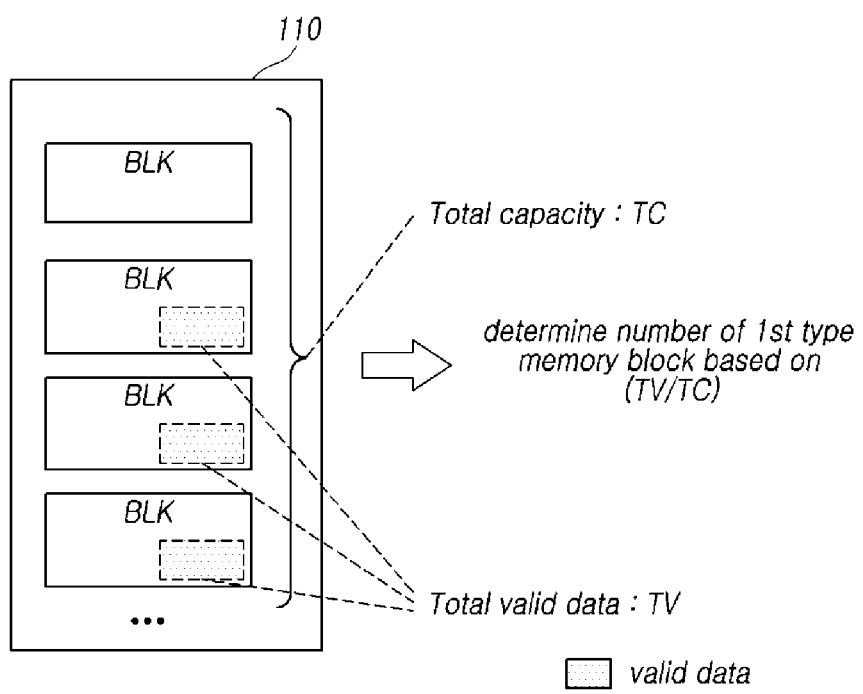
FIGS. 13 and 14 are diagrams illustrating an example of determining the number of first type memory blocks by a memory system according to embodiments of the present disclosure.
Figure 14:
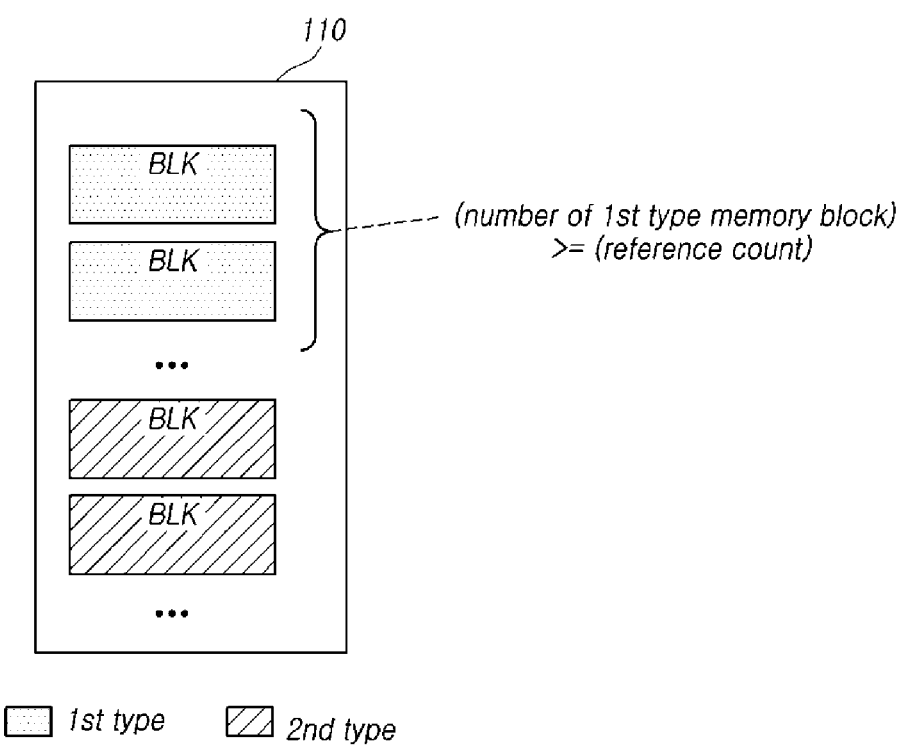

FIGS. 13 to 14 are diagrams illustrating an example of determining the number of first type memory blocks by the memory system 100 according to embodiments of the present disclosure.

Referring to FIG. 13, the memory controller 120 of the memory system 100 may determine the number of first type memory blocks based on a ratio value of the total sum TV of valid data stored in the memory device 110 to the maximum storage capacity TC of the memory device 110.

For example, in the case that the maximum storage capacity or total capacity of the memory device is 128 GB and the total amount of valid data is 12.8 GB, the memory controller 120 may determine the number of first type memory blocks to be 10% of the total number of the plurality of memory blocks included in the memory device 110.

Referring to FIG. 14, the memory controller 120 of the memory system 100 may determine the number of first type memory blocks to be equal to or greater than a set reference count. That is, the memory controller 120 may always set at least the reference count or more of the memory blocks among the plurality of memory blocks included in the memory device 110 as the first type memory block.

In this case, the reference count may be determined differently according to the characteristics of the memory device 110. For example, the reference count may be determined according to the number of memory blocks included in an over-provisioning (OP) area included in the memory device 110 of the memory system 100. For example, the reference count may be ½ of the number of memory blocks included in the over-provisioning (OP) area.

The memory controller 120 may increase the total write capacity or the total bytes written (TBW) of the memory system 100 by determining the number of first type memory blocks equal to or greater than the preset reference count. This is because, as described above, the value of the program/erase cycle of the first type memory block is greater than the value of the program/erase cycle of the second type memory block.

Figure 15:
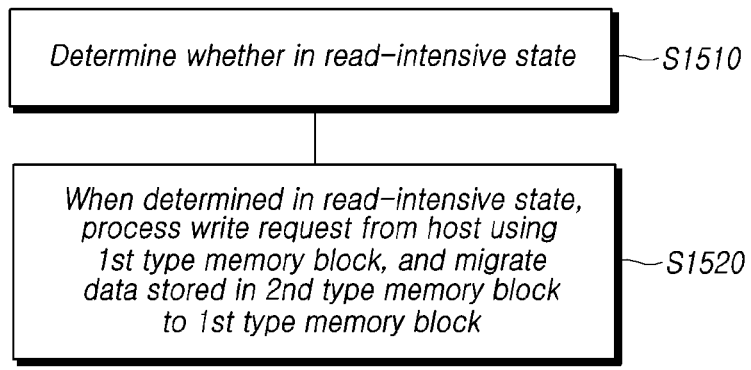
FIG. 15 is a diagram illustrating an operating method of a memory system according to embodiments of the present disclosure.

FIG. 15 is a diagram illustrating the operating method of the memory system 100 according to embodiments of the present disclosure.

Referring to FIG. 15, an operating method of the memory system 100 may include determining whether the memory system is in the read-intensive state (S1510).

In addition, the operating method of the memory system 100 may include, when determining that the memory system 100 is in the read-intensive state, processing a write request received from a host, which is configured to request the memory system to read or write data, by using at least one first type memory block among the plurality of memory blocks, and migrating data stored in at least one second type memory block among the plurality of memory blocks to the at least one first type memory block (S1520).

In this case, the number of bits that can be stored in a memory cell included in the first type memory block may be less than the number of bits that can be stored in a memory cell included in the second type memory block.

In operation S1510, the memory system 100 may determine whether the memory system is in the read-intensive state when the total amount of data that are read-requested by the host from the reference time point is equal to or greater than a threshold.

As an example, in operation S1510, the memory system 100 may determine that the memory system is not in the read-intensive state when the K value, which is a ratio value of the total amount of valid data stored in the memory device 110 to the maximum storage capacity of the memory device 110, is equal to or greater than the threshold ratio.

As another example, in operation S1510, when the K value is less than the threshold ratio, the memory system 100 may determine whether the memory system is in the read-intensive state based on the R value, which is a ratio value of the total amount of valid data stored in the memory device to the total amount of data that are read-requested by the host. In this case, the memory system 100 may determine that the memory system is in the read-intensive state when the R value is less than or equal to a first ratio, and may determine that the memory system is not in the read-intensive state when the R value is greater than or equal to a second ratio.

When it is determined that the memory system 100 is in the read-intensive state, the operation of migrating data stored in the second type memory block to the first type memory block may be executed in the idle state. In this case, the order of migrating data stored in the second type memory block to the first type memory block may be determined according to a descending order of read counts of the second type memory blocks.

The operating method of the memory system 100 may further include, when it is determined that the memory system 100 is in the read-intensive state, suspending an operation of migrating data stored in the first type memory block to the second type memory block.

Moreover, the number of first type memory blocks may be determined based on a ratio value of the total amount of valid data stored in the memory device 110 to a maximum storage capacity of the memory device 110. In this case, the number of the first type memory blocks may be equal to or greater than the set reference count.

In some implementations, the operation of the memory controller 120 described above may be controlled by the control circuit 123, and may be performed in such a manner that the processor 124 executes (drives) firmware in which the overall operation of the memory controller 120 is programmed.

Figure 16:
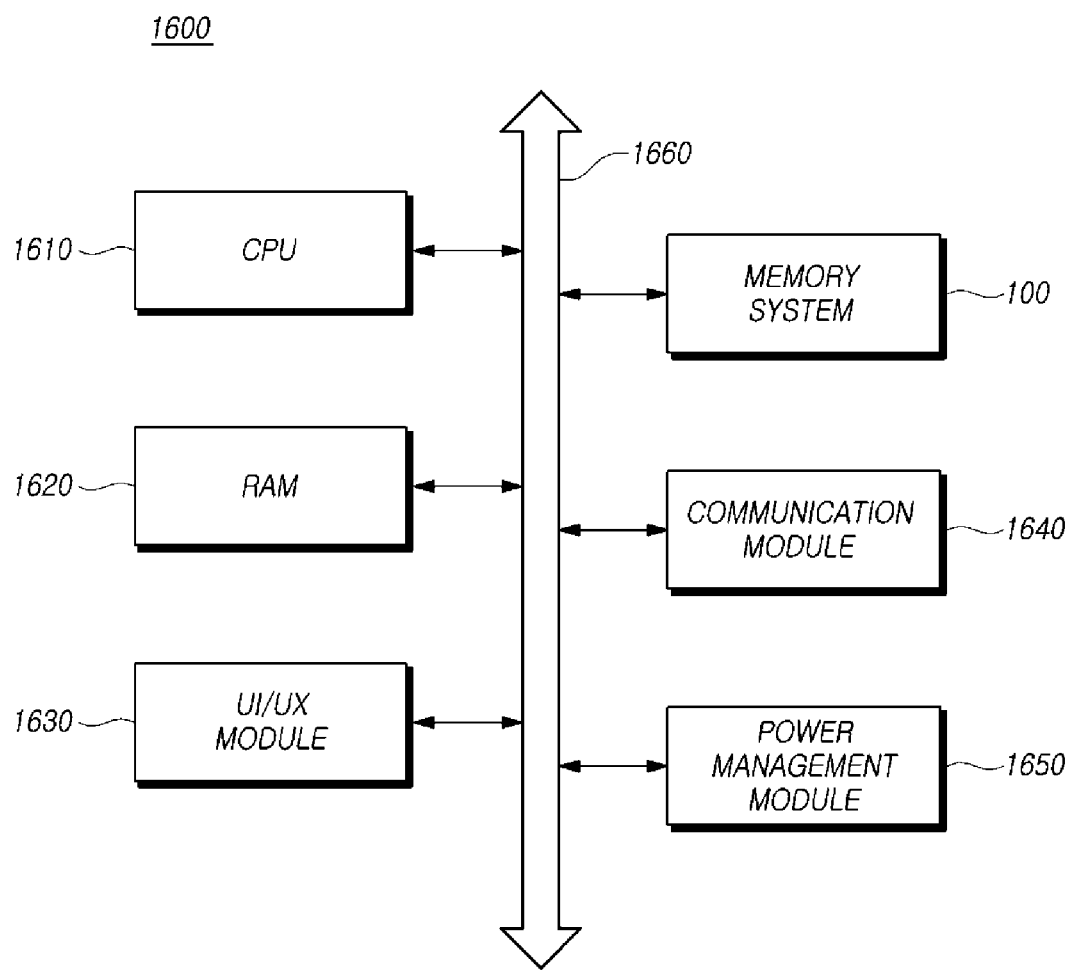
FIG. 16 is a diagram illustrating the configuration of a computing system based on some embodiments of the disclosed technology.

FIG. 16 is a diagram illustrating the configuration of a computing system 1600 based on an embodiment of the disclosed technology.

Referring to FIG. 16, the computing system 1600 based on an embodiment of the disclosed technology may include: a memory system 100 electrically connected to a system bus 1660; a CPU 1610 configured to control the overall operation of the computing system 1600; a RAM 1620 configured to store data and information related to operations of the computing system 1600; a user interface/user experience (UI/UX) module 1630 configured to provide the user with a user environment; a communication module 1640 configured to communicate with an external device as a wired and/or wireless type; and a power management module 1650 configured to manage power used by the computing system 1600.

The computing system 1600 may be a personal computer (PC) or may include a mobile terminal such as a smartphone, a tablet or various electronic devices.

The computing system 1600 may further include a battery for supplying an operating voltage, and may further include an application chipset, a graphic-related module, a camera image processor, and a DRAM. Other elements would be obvious to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the disclosed technology described above, the operation delay time of the memory system may be advantageously reduced or minimized. In addition, based on an embodiment of the disclosed technology, an overhead occurring in the process of calling a specific function may be advantageously reduced or minimized. Although various embodiments of the disclosed technology have been described with particular specifics and varying details for illustrative purposes, those skilled in the art will appreciate that various modifications, additions and substitutions may be made based on what is disclosed or illustrated in the present disclosure.

The embodiments of the present disclosure disclosed in the present specification and drawings are merely specific examples for easily describing the technical content of the present disclosure and facilitating understanding of the present disclosure and do not limit the scope of the present disclosure. It is apparent to a person skilled in the art to which the present disclosure pertains that other modifications based on the technical spirit of the present disclosure may be carried out in addition to the embodiments disclosed herein. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A memory system comprising:
a memory device including a plurality of memory blocks; and
a memory controller for communicating with the memory device and controlling the memory device,
wherein the memory controller is configured to:
determine whether the memory system is in a read-intensive state in which read operations are executed at a higher rate compared to write operations,
when it is determined that the memory system is in the read-intensive state, process a write request received from a host, which is configured to request the memory system to read or write data, by using at least one first type memory block among the plurality of memory blocks for the write request, and migrate data stored in at least one second type memory block among the plurality of memory blocks to the at least one first type memory block, wherein the at least one first type memory block has a higher operating speed than the at least one second type memory block, and
set a number of bits that can be stored in a memory cell included in the first type memory block having the higher operating speed to be less than a number of bits that can be stored in a memory cell included in the second type memory block.

2. The memory system of claim 1, wherein the memory controller determines whether the memory system is in the read-intensive state when a total amount of data that are read-requested by the host from a reference time point is equal to or greater than a threshold.

3. The memory system of claim 2, wherein the memory controller determines that the memory system is not in the read-intensive state when a K value, which is a ratio value of a total amount of valid data stored in the memory device to a maximum storage capacity of the memory device, is equal to or greater than a threshold ratio.

4. The memory system of claim 3, wherein, when the K value is less than the threshold ratio, the memory controller determines whether the memory system is in the read-intensive state based on an R value, which is a ratio value of the total amount of valid data stored in the memory device to the total amount of data that are read-requested by the host.

5. The memory system of claim 4, wherein the memory controller determines that the memory system is in the read-intensive state when the R value is less than or equal to a first ratio and determines that the memory system is not in the read-intensive state when the R value is greater than or equal to a second ratio,
wherein the value of the second ratio is greater than or equal to the value of the first ratio.

6. The memory system of claim 1, wherein, when it is determined that the memory system is in the read-intensive state, the memory controller executes an operation of migrating the data stored in the at least one second type memory block to the at least one first type memory block when the memory system enters an idle state.

7. The memory system of claim 6, wherein the memory controller executes the operation of migrating the data by determining an order of migrating the data stored in the at least one second type memory block to the at least one first type memory block according to a descending order of read counts of the at least one second type memory block.

8. The memory system of claim 1, wherein, when it is determined that the memory system is in the read-intensive state, the memory controller is further configured to suspend migrating data stored in the at least one first type memory block to the at least one second type memory block.

9. The memory system of claim 1, wherein the memory controller is further configured to determine a count of the first type memory block based on a ratio value of a total amount of valid data stored in the memory device to a maximum storage capacity of the memory device.

10. The memory system of claim 9, wherein the memory controller determines the count of the first type memory block to be equal to or greater than a set reference count.

11. An operating method of a memory system including a memory device having a plurality of memory blocks, the operating method comprising:
determining whether the memory system is in a read-intensive state in which read operations are executed at a higher rate compared to write operations; and
when it is determined that the memory system is in the read-intensive state, processing a write request received from a host, which is configured to request the memory system to read or write data, by using at least one first type memory block among the plurality of memory blocks for the write request, and migrating data stored in at least one second type memory block among the plurality of memory blocks to the at least one first type memory block, wherein the at least one first type memory block has a higher operating speed than the at least one second type memory block, and
wherein a number of bits that can be stored in a memory cell included in the first type memory block having the higher operating speed is less than a number of bits that can be stored in a memory cell included in the second type memory block.

12. The operating method of the memory system of claim 11, wherein determining whether the memory system is in the read-intensive state includes determining whether the memory system is in the read-intensive state when a total amount of data that are read-requested by the host from a reference time point is equal to or greater than a threshold.

13. The operating method of the memory system of claim 12, wherein determining whether the memory system is in the read-intensive state includes determining that the memory system is not in the read-intensive state when a K value, which is a ratio value of a total amount of valid data stored in the memory device to a maximum storage capacity of the memory device, is equal to or greater than a threshold ratio.

14. The operating method of the memory system of claim 13, wherein determining whether the memory system is in the read-intensive state includes determining, when the K value is less than the threshold ratio, whether the memory system is in the read-intensive state based on an R value, which is a ratio value of the total amount of valid data stored in the memory device to the total amount of data that are read-requested by the host.

15. The operating method of the memory system of claim 14, wherein determining whether the memory system is in the read-intensive state includes determining that the memory system is in the read-intensive state when the R value is less than or equal to a first ratio and determining that the memory system is not in the read-intensive state when the R value is greater than or equal to a second ratio,
wherein the value of the second ratio is greater than or equal to the value of the first ratio.

16. The operating method of the memory system of claim 11, wherein, when it is determined that the memory system is in the read-intensive state, the migrating of the data stored in the at least one second type memory block to the at least one first type memory block is executed when the memory system enters an idle state.

17. The operating method of the memory system of claim 16, wherein the migrating the data includes determining an order of the migrating the data stored in the at least one second type memory block to the at least one first type memory block according to a descending order of read counts of the at least one second type memory block.

18. The operating method of the memory system of claim 11, further comprising, when it is determined that the memory system is in the read-intensive state, suspending an operation of migrating data stored in the at least one first type memory block to the at least one second type memory block.

19. The operating method of the memory system of claim 11, further comprising determining a count of the first type memory block based on a ratio value of a total amount of valid data stored in the memory device to a maximum storage capacity of the memory device.

20. The operating method of the memory system of claim 19, wherein the count of the first type memory block is determined as equal to or greater than a set reference count.

* * * * *